United States Patent
Apel et al.

(10) Patent No.: US 7,382,186 B2
(45) Date of Patent: Jun. 3, 2008

(54) AMPLIFIERS WITH HIGH EFFICIENCY IN MULTIPLE POWER MODES

(75) Inventors: Thomas R. Apel, Portland, OR (US); Paul E. Laferriere, Hillsboro, OR (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 91 days.

(21) Appl. No.: 11/042,623

(22) Filed: Jan. 24, 2005

(65) Prior Publication Data

US 2006/0164163 A1 Jul. 27, 2006

(51) Int. Cl.
*H03G 3/20* (2006.01)
(52) U.S. Cl. .................. 330/129; 330/124 R; 330/51
(58) Field of Classification Search ............... 330/129; 455/127.3
See application file for complete search history.

(56) References Cited

U.S. PATENT DOCUMENTS

| | | | |
|---|---|---|---|
| 5,008,631 A * | 4/1991 | Scherer et al. ............... 330/51 |
| 5,017,888 A | 5/1991 | Meinzer |
| 5,025,225 A * | 6/1991 | Tajima et al. ............ 330/124 D |
| 5,152,004 A | 9/1992 | Väisänen et al. |
| 5,175,871 A | 12/1992 | Kunkel |
| 5,909,643 A | 6/1999 | Aihara |
| 6,069,526 A | 5/2000 | Ballantyne |
| 6,091,966 A | 7/2000 | Meadows |
| 6,271,722 B1 | 8/2001 | Ballantyne |
| 6,288,608 B1 | 9/2001 | Jadus et al. |
| 6,603,359 B2 | 8/2003 | Fujiwara et al. |
| 6,700,439 B2 | 3/2004 | Jackson |
| 6,738,432 B2 | 5/2004 | Pehlke et al. |
| 6,781,455 B2 | 8/2004 | Kim |
| 6,900,692 B2 | 5/2005 | Kim et al. |
| 6,960,959 B2 * | 11/2005 | Komatsu et al. ............ 330/295 |

(Continued)

FOREIGN PATENT DOCUMENTS

WO WO 03/065598 8/2003

OTHER PUBLICATIONS

"3V HBT GaAs CDMA 4x4mm Power Amplifier Module" TriQuint Semiconductor, TQM713019 Advance Data Sheet, 15 pp. (document marked Aug. 25, 2004).
"2.7V, Single-Supply, Cellular-Band Linear Power Amplifiers," Maxim Integrated Products, pp. 1-15 (document marked Feb. 2001).

(Continued)

*Primary Examiner*—Robert J. Pascal
*Assistant Examiner*—Alan Wong
(74) *Attorney, Agent, or Firm*—Klarquist Sparkman

(57) ABSTRACT

Described herein are representative embodiments of amplifiers having selectable power output while maintaining low power consumption. In certain exemplary embodiments, the amplifiers are operated as linear power amplifiers, such as may be used in wireless communication systems. According to one exemplary embodiment, a circuit is described comprising a control system configured to operate the circuit in at least a first mode and a second mode. The circuit of this embodiment further includes a first amplifier section configured to amplify at least a portion of an input signal and produce a first amplified signal on a first signal path in the first mode of operation, a second amplifier section configured to amplify at least a portion of an input signal and produce a second amplified signal on a second signal path in the second mode of operation, and an impedance inverter having an input coupled to the first and second signal paths.

17 Claims, 6 Drawing Sheets

U.S. PATENT DOCUMENTS

| | | | |
|---|---|---|---|
| 7,157,966 B2 | 1/2007 | Baree et al. | |
| 2004/0056711 A1 | 3/2004 | Apel, Jr. | |
| 2004/0108900 A1 | 6/2004 | Apel | |
| 2004/0108901 A1 | 6/2004 | Apel et al. | |
| 2004/0130391 A1 | 7/2004 | Kim et al. | |
| 2005/0068101 A1 | 3/2005 | Kim et al. | |
| 2005/0083117 A1 | 4/2005 | Kim et al. | |
| 2005/0099227 A1 | 5/2005 | Kim et al. | |
| 2006/0022755 A1* | 2/2006 | Prodanov | 330/295 |
| 2006/0103466 A1* | 5/2006 | Shah et al. | 330/295 |

OTHER PUBLICATIONS

Wongkomet et al., "Efficiency Enhancement Technique for RF CMOS Power Amplifier," 17 pp. (document downloaded from http://bwrc.eecs.berkeley.edu/Presentations/Retreats/Winter_Retreat_2004/Tuesday%20AM/Wongkomet_presentation_1_2004v2.ppt, on Aug. 15, 2005).

Zhao et al., "A 900 MHz Doherty Amplifier Implemented with Lumped Elements," 14 pp. (document downloaded from http://paworkshop.ucsd.edu/papers2003/YZhaoPAworkshop2003.ppt, on Aug. 15, 2005).

* cited by examiner

AMPLIFIERS WITH HIGH EFFICIENCY IN MULTIPLE POWER MODES

TECHNICAL FIELD

The present application relates generally to amplifiers, such as linear amplifiers as may be used to amplify radio frequency (RF) signals.

BACKGROUND

In the past two decades, the market for wireless communication systems has shown unprecedented growth. In addition to the widespread proliferation of mobile phone services, wireless local area networks (WLANs) operating according to wireless standards such as IEEE 802.11a, IEEE 802.11b and IEEE 802.11 g are becoming more common. As the popularity of wireless systems increases, so does the demand for improved performance in the wireless transceivers supporting such systems.

One of the components in a wireless transceiver that can affect performance is the power amplifier. For example, linear power amplifiers are often used in mobile transceivers to amplify radio frequency (RF) signals to be transmitted from the transceiver. Linear amplification is typically required in such transceivers to support the signal processing methods used to encode the RF transmissions (for example, Code Division Multiple Access (CDMA), Time Division Multiple Access (TDMA), or Enhanced Data GSM Environment (EDGE) processing). Further, because of the mobile nature of many wireless devices, the power amplification required for proper transmission is not necessarily constant. Consider, for example, a typical CDMA handset used in a cellular telephone network. Typical CDMA handsets are desirably capable of producing output powers of up to +28 dBm. The average output power that is necessary for such handsets, however, is far less than this maximum, and is generally closer to 0 dBm. The power required for proper transmission is typically dependent on the distance of the handset to the corresponding base station, and thus varies as the handset is transported from location to location. Further, because the typical handset draws its power from the handset battery, operating the linear power amplifier with optimal efficiency at the various required power levels would extend battery life, and thus the talk time of the handset. Accordingly, there exists a need for improved amplifiers that can operate with enhanced efficiency in multiple power modes, thereby providing the necessary peak power in one mode and efficient, low-power operation in another.

DETAILED DESCRIPTION

Figure 1:
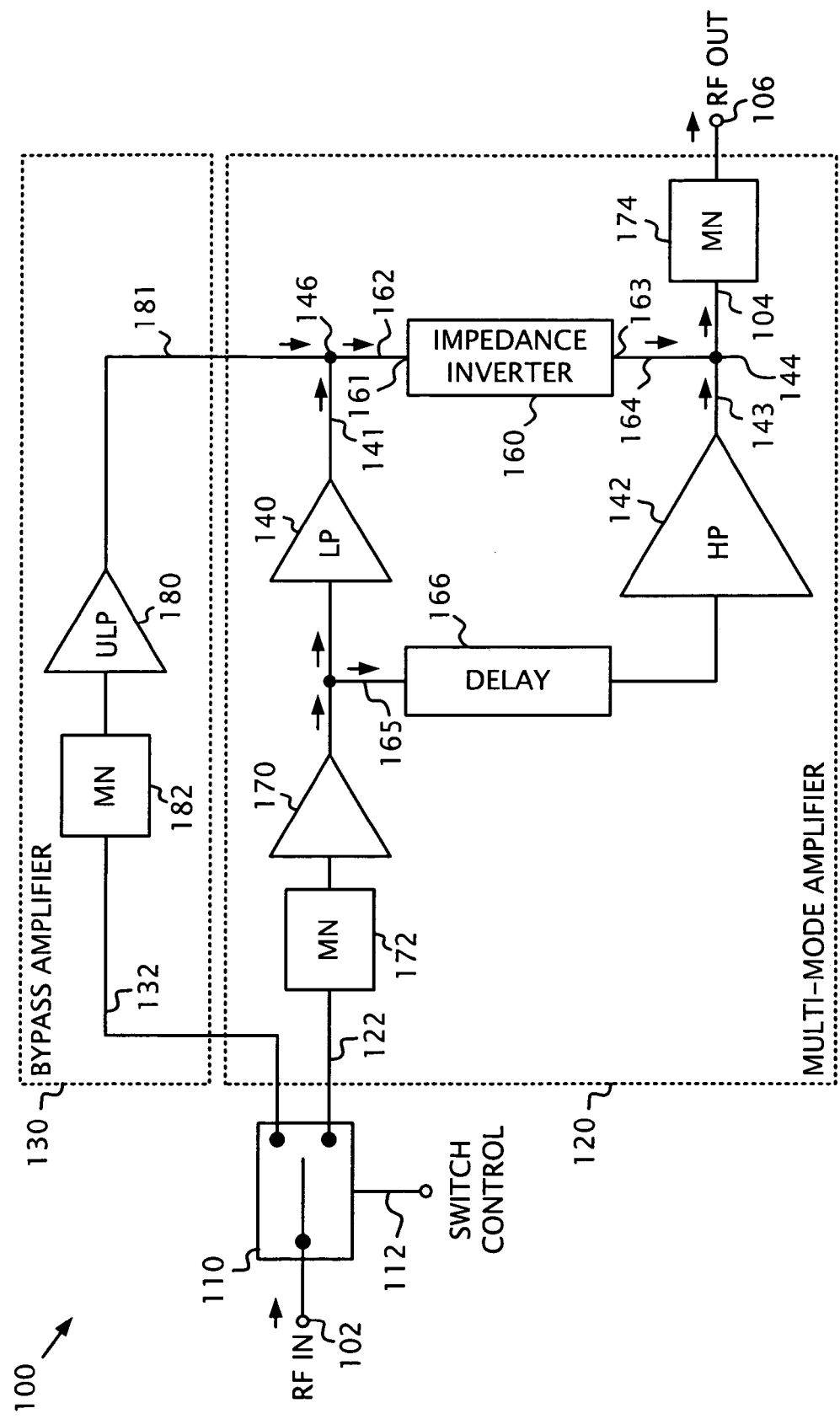
FIG. 1 is a schematic block diagram of an amplifier circuit in accordance with a first representative embodiment of the disclosed technology.

This application is related to U.S. Patent Application Publication No. 2004/0108901, entitled "LINEAR POWER AMPLIFIER WITH MULTIPLE OUTPUT POWER LEVELS," the content of which is considered to be part of the present application and is hereby incorporated herein by reference. This application is also related to U.S. Patent Application Publication No. 2004/0056711, entitled "EFFICIENT POWER CONTROL OF A POWER AMPLIFIER BY PERIPHERY SWITCHING," the content of which is also considered to be part of the present application and is hereby incorporated herein by reference.

As used in this application and in the claims, the singular forms "a," "an," and "the" include the plural forms unless the context clearly dictates otherwise. Additionally, the term "includes" means "comprises." Further, the term "coupled" means electrically or electromagnetically connected or linked and does not exclude the presence of intermediate elements between the coupled items.

Disclosed below are representative embodiments of an amplifier circuit that may be used, for example, as part of a wireless communication system. Also disclosed herein are exemplary methods by which the embodiments can operate or be operated. Exemplary environments and applications for the disclosed embodiments are also disclosed. For example, the disclosed embodiments can be used in a variety of applications that involve the amplification of RF signals over a range of power levels. The described systems, apparatus, and methods should not be construed as limiting in any way. Instead, the present disclosure is directed toward all novel and nonobvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. For example, although any of the disclosed embodiments may be implemented as part of an RF transceiver in a wireless communication system (for example, in a cellular telephone handset, such as a CDMA handset), the other components of the RF transceiver are well known in the art and are not described in further detail. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

The disclosed embodiments can be implemented in a wide variety of circuits (for example, application-specific integrated circuits (ASICs), systems-on-a-chip (SOCs), systems in a package (SIPs), systems on a package (SOPs), multi-chip modules (MCMs), or other such devices). The disclosed embodiments can also be implemented using a variety of different semiconductor processes, including but not limited to gallium arsenide (GaAs), indium phosphide, and silicon-based processes (for example, complementary metal-oxide-semiconductor (CMOS) processes). The disclosed embodiments can also be implemented in a variety of different off-chip processes, including but not limited to low- or high-frequency printed circuit board (PCB) processes, thick- or thin-film hybrid processes, multi-layered organic processes, and low-temperature cofired ceramic (LTCC) processes.

Similarly, a variety of transistor technologies or combinations and subcombinations thereof can be used to implement the disclosed embodiments. For example, the disclosed amplifier embodiments can be implemented using bipolar junction transistor (BJT) technologies (for example, heterojunction bipolar junction transistors (HBTs)) or field effect transistor (FET) technologies (for example, pseudomorphic high electron mobility transistors (pHEMTs)). Combinations of these technologies can also be used to implement the disclosed amplifier embodiments. For example, in one embodiment that utilizes an RF switch for routing an RF signal, the amplification sections of the circuit are implemented using an HBT process, whereas the RF switch and the related control systems are implemented at least in part using a pHEMT process. Embodiments utilizing combinations of process technologies can be realized on multiple chips or on a single chip.

The example amplifiers, control circuits, and switching mechanisms can be included in a variety of wireless devices. For example, such devices can be included in mobile devices such as cell phones, personal digital assistants, mobile media players, laptop computers, and pagers to provide improved battery life. Devices based on wireless standards such as 802.11a, 802.11b, 802.11 g, and BLUETOOTH may also include such devices. Other devices (both fixed and mobile) that use wireless communications such as keyboards, pointing devices, media distribution devices, and desktop computers can also include such devices. In a representative example, a cell phone or mobile station can include a control circuit configured to provide a bypass-control signal and a high/low-control signal to select an operational mode of an amplifier that includes a bypass amplifier subsection and a multi-mode amplifier subsection. In other representative examples, a cell phone can include a switch configured to selectively deliver a communication signal, such as an RF signal, to a bypass amplifier or a power amplifier. In some examples, the power amplifier can be a multi-mode amplifier. Other wireless devices can be similarly configured. Other applications for the disclosed embodiments include WLAN systems, wireless systems using TDMA or EDGE modulation techniques, and other such systems.

FIG. 1 is a schematic block diagram illustrating an exemplary embodiment of a circuit 100 in accordance with the disclosed technology. Circuit 100 comprises a switching mechanism 110 configured to receive an input signal (such as an RF input signal ("RF IN")) at an input node 102 and to selectively route the input signal to either a first amplifier 120 or to a second amplifier 130. (The arrows in FIG. 1 and in the other figures show the direction of RF-signal propagation.) In FIG. 1, a switch-control signal is coupled to a switch-control input 112 and is used to control the switching mechanism 110. In a first mode of operation selected by the switch-control signal, the switching mechanism 110 routes the input signal via a path 122 to the first amplifier 120; and, in a second mode of operation, the switching mechanism 110 routes the input signal onto bypass path 132 to a second amplifier 130, which is usually referred to herein as the "bypass amplifier." In several of the disclosed embodiments, the first amplifier 120 is itself configured to operate in multiple power modes and is usually referred to herein as the "multi-mode amplifier." In this way, the operation of the multi-mode amplifier 120 is extended to include an additional power state (the bypass state).

The multi-mode amplifier 120 can comprise any of the linear power amplifiers described in U.S. Patent Application Publication No. 2004/0108901 or other linear or non-linear amplifiers. In the illustrated embodiment, for example, the multi-mode amplifier 120 comprises two parallel-connected amplifier subsections 140, 142. According to one exemplary embodiment, the amplifier subsection 140 is configured to produce a smaller power gain than the amplifier subsection 142. For example, the amplifier subsection 140 may comprise M parallel-connected transistors, and the amplifier subsection 142 may comprise N parallel-connected transistors, where M<N so that the amplifier subsection 140 consumes less power in operation than the amplifier subsection 142. For this reason, the amplifier subsection 140 is usually referred to herein as the "low-power amplifier subsection" ("LP" in the figures), and the amplifier subsection 142 is usually referred to as the "high-power amplifier subsection" ("HP" in the figures). In one specific embodiment, the amplifier subsection 140 comprises seven HBT cells, whereas the amplifier subsection 142 comprises sixteen HBT cells. It is understood, however, that in other embodiments, the amplifier subsections 140, 142 have other power relationships and/or comprise other numbers or sizes of transistors.

In some embodiments, the low-power amplifier subsection 140 and the high-power amplifier subsection 142 are configured to operate in multiple power modes to provide different levels of power gain and power consumption. For example, the amplifier subsections 140, 142 may be controllable via one or more control signals (not shown) to operate in either a high-power mode or a low-power mode. According to one particular implementation, both of the amplifier subsections 140, 142 are enabled in the high-power mode, whereas only the low-power amplifier subsection 140 is enabled in the low-power mode. In a particular embodiment of the circuit 100 comprising seven HBTs in the low-power amplifier subsection 140 and sixteen HBTs in the high-power amplifier subsection 142, the circuit produces a maximum output power of about +28 dBm in the high-power mode and an output power of about or less than +16 dBm in low-power mode.

The circuit 100 shown in FIG. 1 includes an impedance inverter 160 that provides a desired load impedance during high-power operation and a different desired load impedance during low-power operation. In FIG. 1, an input 161 of the impedance inverter 160 is coupled to a combined low-power signal path 162, and an output 163 of the impedance inverter is coupled to an impedance-inverter output path 164. The impedance-inverter output path 164 is combined at a junction 144 with a high-power signal path 143 from the high-power amplifier subsection 142 to form a combined output path 104. The combined output path 104 is coupled to an impedance matching network 174 and an output node 106.

An impedance inverter can be characterized as a circuit portion configured to produce an impedance at its input that is inversely related to the impedance of a load coupled to its output. Thus, for example, the impedance at the input of an impedance inverter increases as the load at the output decreases. In one particular embodiment, for example, the impedance inverter 160 can be configured to operate substantially in accordance with the equation, $Z_O{}^2 = Z_{IN} \times Z_{OUT}$, where $Z_O$ is the characteristic impedance of the impedance inverter, $Z_{IN}$ is the impedance at the input of the impedance inverter, and $Z_{OUT}$ is the load impedance at the output of the impedance inverter. Further, in one particular implementation of this embodiment, the characteristic impedance of the impedance inverter 160 is selected to match the impedance of the low-power amplifier subsection 140 during high-power operation of the multi-mode amplifier 120. That is, the characteristic impedance of the impedance inverter 160 is selected such that when both the low-power amplifier subsection 140 and the high-power amplifier subsection 142 are enabled, the impedance at the input of the impedance inverter 160 matches or approximately matches the impedance of the low-power path 164. Thus, the low-power amplifier subsection 140 is also loaded with that impedance. The impedance match between the low-power amplifier subsection 140 and the impedance inverter 160 results in efficient power transfer during high-power operation to the downstream load at the output node 106.

During low-power operation, the high-power amplifier subsection 142 is disabled. Because the transistors in the high-power amplifier subsection 142 are disabled, the impedance associated with the high-power signal path 143 becomes very high (effectively an open circuit). Thus, the output of the impedance inverter 160 becomes fully loaded by the downstream load at the output node 106, and the load impedance at the output of the impedance inverter decreases from that of the high-power mode. In the illustrated embodiment, the impedance at the input of the impedance inverter 160 is therefore transformed to a higher impedance. Accordingly, the load impedance presented to the low-power amplifier subsection 140 at the input of the impedance inverter 160 is greater during low-power operation than during high-power operation. The increased impedance reduces the operational current at which the transistors in the low-power amplifier subsection 140 operate, and thereby improves the amplifier efficiency during low-power operation. In this way, the low-power amplifier subsection 140 can be said to have a dynamic load line. Therefore, according to this embodiment, the configuration of the multi-mode amplifier 120 allows for a load impedance that substantially matches the low-power amplifier subsection 140 during high-power operation, and for a relatively high load impedance during low-power operation.

The impedance inverter 160 typically imparts a delay or phase shift on the amplified signal on the impedance-inverter output path 164. In order to match the delay or phase shift for efficient current combining at junction 144, a delay element 166 can be inserted in path 165 that is routed to the input of the high-power amplifier subsection 142.

Further, as shown in FIG. 1, the multi-mode amplifier 120 can further include a preliminary amplifier subsection 170, thus dividing the multi-mode amplifier 120 into multiple stages or sections. The preliminary amplifier subsection 170 may comprise one or more additional amplifier stages. For example, the preliminary amplifier subsection 170 may comprise parallel-coupled amplifier subsections similar to those shown at amplifier subsections 140, 142, or other amplifier arrangements (for example, serially coupled amplifier stages). Alternatively, the multi-mode amplifier 120 may exclude the preliminary amplifier subsection 170 altogether and only comprise the low-power amplifier subsection 140 and the high-power amplifier subsection 142.

The illustrated multi-mode amplifier 120 further includes impedance matching networks 172, 174 ("MN" in the figures) as are known in the art. Typically, the impedance matching networks are configured to transform the impedance associated with a downstream component or load such that it matches (or substantially matches) the impedance associated with an upstream signal path. Those of skill in the art will recognize that in embodiments comprising the preliminary amplifier subsection 170, one or more additional inter-stage impedance matching networks (not shown) may be included in the circuit 100.

The bypass amplifier 130 illustrated in FIG. 1 comprises an amplifier subsection 180 configured to amplify the input signal on the bypass path 132. In the illustrated embodiment, the bypass path 132 is a dedicated path that is isolated from the multi-mode amplifier 120. In one particular embodiment, the amplifier subsection 180 is configured to consume less power and to produce a lower power output than both the low-power amplifier subsection 140 and the high-power amplifier subsection 142. Accordingly, the amplifier subsection 180 is usually referred to herein as the "ultra-low-power amplifier subsection" ("ULP" in the figures). It is understood, however, that in other embodiments, the amplifier subsection 180 has another power relationship to the amplifier subsections 140, 142 and/or comprises other numbers or sizes of transistors. Desirably, the bypass path 132 has as few additional circuit elements and junctions as possible in order to reduce signal losses along the bypass path 132. In one particular embodiment, the ultra-low-power amplifier subsection 180 comprises a single-stage amplifier comprising one transistor. In certain implementations of this embodiment, the ultra-low-power amplifier subsection 180 comprises a single HBT cell operating with a quiescent current of less or equal to 8 mA (for example, with a quiescent current substantially equal to 6 mA). In other embodiments, however, other numbers of transistors or stages are included in the bypass amplifier 130. In the illustrated embodiment, the bypass path 132 further includes an impedance matching network 182 configured to match the impedance of the upstream signal source coupled to the input node 102.

In FIG. 1, the ultra-low-power amplifier subsection 180 produces an amplified signal on ultra-low-power signal path 181, which is coupled to the low-power signal path 141 at junction 146 and to the input of an impedance inverter 160. Thus, in this embodiment, the low-power amplifier subsection 140 and the ultra-low-power amplifier subsection 180 share the impedance inverter 160.

In operation, and according to one exemplary embodiment, the multi-mode amplifier 120 and the bypass amplifier 130 are operated at mutually exclusive times. That is, during a first mode (or set of modes) of operation, the switch 110 routes the input signal onto the path 122 and the multi-mode amplifier 120 is enabled while the bypass amplifier 130 is disabled. During the ultra-low-power mode of operation, the switch 110 routes the input signal onto the bypass path 132 and the bypass amplifier 130 is enabled while the multi-mode amplifier 120 is disabled. When the multi-mode amplifier 120 is enabled and the bypass amplifier 130 is disabled, the impedance on the ultra-low-power signal path 181 is very large (effectively, an open circuit), and the multi-mode amplifier 120 operates without substantial loading or other interaction with the disabled ultra-low-power amplifier 180. Likewise, when the bypass amplifier 130 is enabled and the multi-mode amplifier 120 is disabled, the impedance on the low-power signal path 141 is very high, allowing the bypass amplifier 130 to operate without substantial loading or other interaction with the amplifier subsections 140, 142. Further, because the multi-mode amplifier 120 is disabled during operation of the bypass amplifier 130, the impedance inverter 160 transforms the impedance at output 106 into a higher transformed impedance as described above, thereby allowing the bypass amplifier 130 to operate more efficiently. Because of the increased impedance at the impedance inverter input 161 and reduced active (biased) transistor size, the ultra-low-power amplifier subsection 180 can operate at a relatively low current with relatively high efficiency and gain. Further, because the bypass amplifier 130 comprises only a few components (in one embodiment, an impedance matching network and a single HBT transistor) and because the ultra-low-power amplifier subsection 180 shares the impedance inverter 160 with the multi-mode amplifier 120, the overall substrate area required for the bypass amplifier 130 is relatively small.

Figure 2:
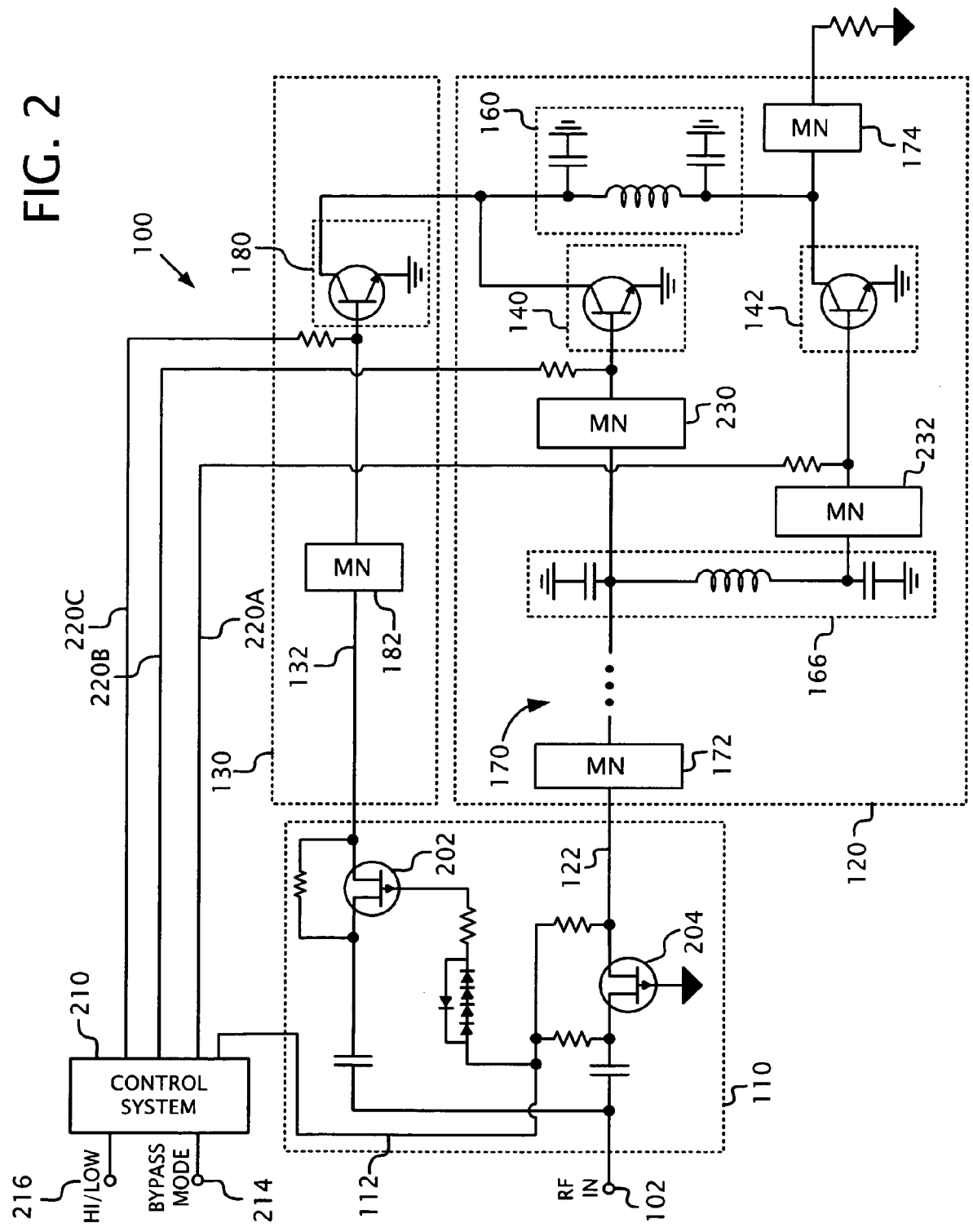
FIG. 2 is a schematic circuit diagram showing a more specific implementation of the amplifier circuit of FIG. 1.

FIG. 2 is a schematic block diagram showing a more specific implementation of the exemplary circuit 100 described above in FIG. 1. In FIG. 2, the switching mechanism 110 comprises an RF switch. In particular, the illustrated switching mechanism 110 serves as a single-pole double-throw RF switch comprising resistors, capacitors, diodes, and transistors 202, 204 (for example, pHEMTs) configured to allow the switch to operate with low loss. In the illustrated embodiment, the switching mechanism 110 is controlled by a control system 210 that is also configured to control application of predetermined or variable bias voltages to the amplifiers 120, 130 (for example, to the amplifier subsections 140, 142, 180). In particular, the control system 210 comprises a network configured to provide variable DC bias voltages to transistors in the amplifier subsections 140, 142, 180 such that power consumption by the amplifier circuit 100 can be selected based on a selected power mode. For illustrative purposes only, a single transistor is shown in each of the amplifier subsections 140, 142, 180. In the actual implementations, however, each of the amplifier subsections 140, 142, 180 may contain multiple transistor cells (for example, seven, sixteen, and one in the respective amplifier subsections 140, 142, 180). In a particular example, these transistors are heterojunction bipolar transistors (HBTs).

In the illustrated embodiment, two single-bit control signals (a bypass-mode signal and a hi/low signal) are coupled to respective control inputs 214, 216 to select a power mode for amplifier circuit operation. Specifically, if the bypass-mode is selected by the bypass-mode signal (which may be a high value or a low value), the switching mechanism 110 receives a switch-control signal via the switch-control path 112 and routes the input signal from the input node 102 onto the bypass path 132 and to the bypass amplifier 130. In this situation, the control system 210 also produces a power control signal such as a DC bias voltage on bias-voltage path 220C such that the ultra-low-power amplifier subsection 180 operates in a normal, fully biased state. According to one exemplary implementation, this causes the one or more transistors in the ultra-low-power amplifier subsection 180 to operate as linear amplifiers (for example, as deep class AB amplifiers, approaching class B linear amplifiers). The control system 210 also provides power control signals, such as DC bias voltages on bias-voltage paths 220A, 220B, that reduce or terminate bias voltages such that the low-power amplifier subsection 140 and the high-power amplifier subsection 142 are disabled. When disabled, power consumption by the amplifier subsections 140, 142 is typically reduced. As explained above, when the multi-mode amplifier 120 is disabled and the bypass amplifier 130 is enabled, the impedance at the input of the impedance inverter 160 is relatively high and the ultra-low-power amplifier subsection 180 can operate efficiently.

The bypass-mode signal can also be selected so that the switching mechanism 110 routes the input signal from the input node 102 onto the path 122 and to the multi-mode amplifier 120. In this case, and according to one exemplary embodiment, the value of the hi/low signal applied to the control input 216 is then used to determine whether the multi-mode amplifier 120 is to be operated in high-power mode or low-power mode (as with the bypass-mode signal, the logic values of the hi/low signal that correspond to the high- and low-power modes may vary depending on the implementation). If the multi-mode amplifier 120 is operated in high power mode, both low-power amplifier subsection 140 and high-power amplifier subsection 142 can be biased via bias-voltage paths 220A, 220B to operate in their normal, fully biased states. That is, the transistors in both the amplifier subsections 140, 142 can be adequately biased such that they perform with high linearity. In the low-power mode, high-power amplifier subsection 142 can be disabled by reducing or terminating the DC bias voltage applied to its transistors. In both the high- and low-power modes, the bias voltage on bias-voltage path 220C can be adequately reduced such that the ultra-low-power amplifier subsection 180 is effectively disabled. With the ultra-low-power amplifier subsection 180 disabled, and according to one exemplary implementation, the input impedance at the impedance inverter 160 matches the impedance of the low-power amplifier subsection 140 during high-power operation and is greater than the impedance of the low-power amplifier subsection during low-power operation.

Those of ordinary skill in the art will recognize that there exist numerous bias circuits and control networks that can be used to implement the control system 210. For example, any of the bias control structures and methods described in U.S. Patent Application Publication No. 2004/0056711 can be used to provide bias voltages to the amplifier subsections 140, 142, 180.

In the embodiment illustrated in FIG. 2, the impedance inverter comprises a shunt-C, series-L, shunt-C network. It is understood, however, that the impedance inverter 160 can be implemented using various other components to realize the desired functionality. For instance, the impedance inverter 160 may be implemented as a quarter-wavelength transmission line. Further, in the illustrated embodiment, the delay element 166 similarly comprises a shunt-C, series-L, shunt-C network. The impedance of the delay element 166 is not necessarily the same as the impedance of the impedance inverter 160, and the delay element 166 may be implemented using a variety of known techniques that provide a delay or phase shift.

FIG. 2 further shows the impedance matching networks 172, 182, and impedance matching networks 230, 232, which comprise any suitable impedance matching network as is known in the art. Further, in FIG. 2, the preliminary amplifier subsection 170 is not shown in detail, but it is understood that it may comprise one or more additional amplifiers as described above or may be omitted entirely from the design. In embodiments that include a preliminary amplifier 170, one or more inter-stage impedance matching networks may also be included in the circuit 100.

According to one exemplary embodiment, the multi-mode amplifier 120 and the bypass amplifier 130 are implemented at least in part using an HBT process, whereas the switching mechanism 110 and the control system 210 (as well as the related bias control network) are implemented at least in part using a pHEMT process. This embodiment can be implemented, for example, on two or more chips, on multiple layers of a single chip, or on different areas of a single chip. In other examples, the circuit can be defined on one or more chips using a single process, such as an HBT, pHEMT, or other process.

Figure 3:
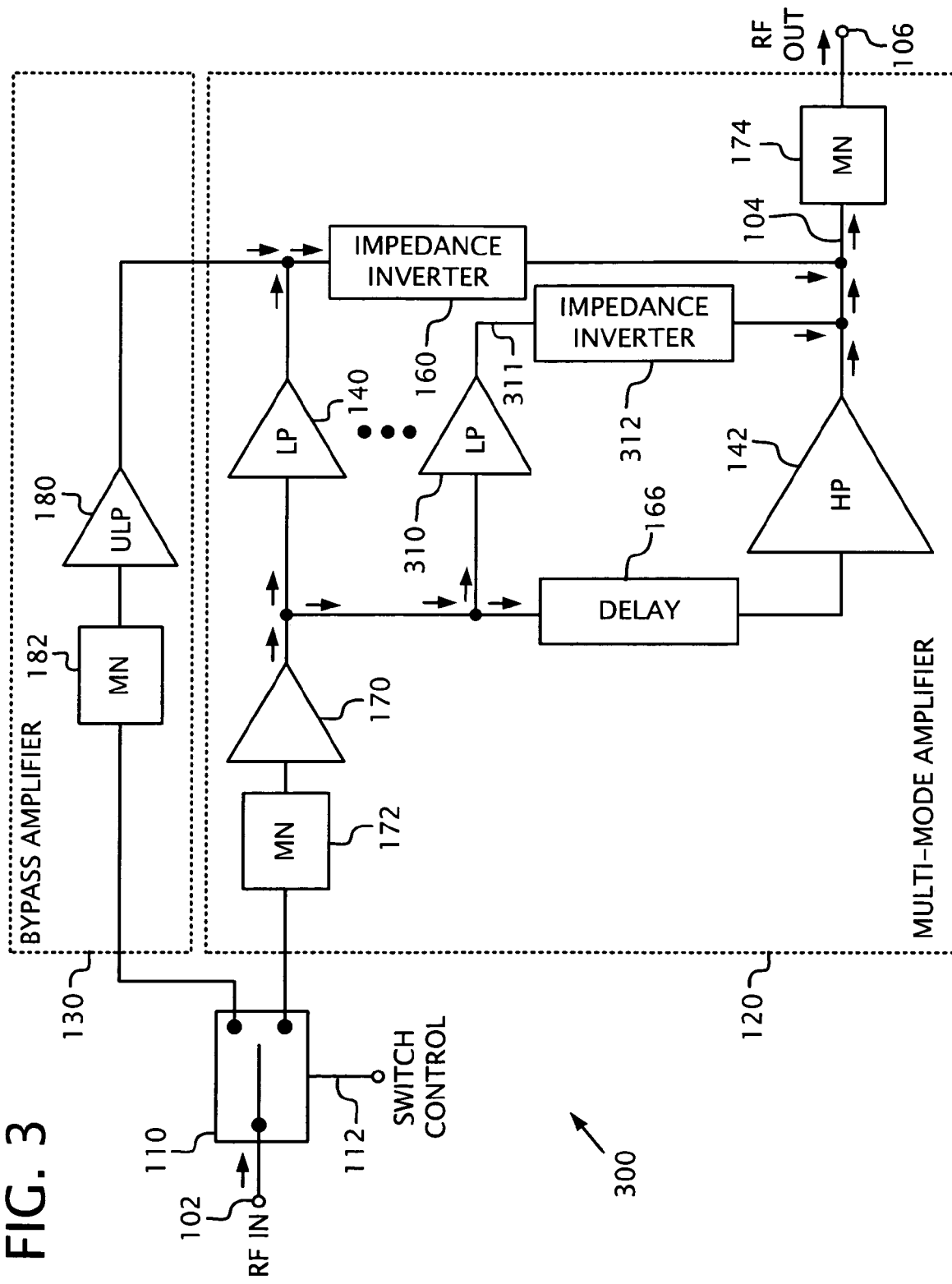
FIG. 3 is a schematic block diagram showing another implementation of the amplifier circuit of FIG. 1.

FIG. 3 is a schematic block diagram illustrating an alternative embodiment to the amplifier circuit 100 shown in FIG. 1. As shown in FIG. 3, the multi-mode amplifier 120 comprises one or more additional parallel-coupled, low-power amplifier subsections 310. For instance, the additional low-power amplifier subsection 310 illustrated in FIG. 3 is coupled in parallel with the amplifier subsections 140, 142 and produces a low-power amplified signal on signal path 311. The signal path 311 is coupled to the input of an impedance inverter 312 configured to transform the impedance at its output in the same manner as the impedance inverter 160 described above. For instance, according to one implementation, the characteristic impedance of the impedance inverter 312 is selected to produce an impedance match when all of the amplifier subsections 140, 142, 310 are enabled, and to produce a greater impedance when the high-power amplifier subsection 142 is disabled. In the illustrated embodiment, the signal output from the impedance inverter 312 is combined with the other amplified signals from the amplifier subsections 140, 142 to form the combined amplified signal on the combined output path 104.

The inclusion of the one or more additional low-power amplifier subsections 310 allows the multi-mode amplifier 120 to operate in additional power modes beyond the modes described above in connection with FIGS. 1 and 2. For example, a control system (not shown) can be used to selectively enable the amplifier subsections 140, 142, 310 to operate in various combinations with one another in order to produce other desired power gains and association power consumptions. In one implementation, the control system is similar to the one described above with respect to FIG. 2 and controls application of bias voltages to the amplifier subsections 140, 142, 310. The bias voltages can then be controlled to selectively disable or enable one or more of the amplifier subsections. In such embodiments, more than two one-bit control signals may be required by the control system in order to select any particular mode. Further, although the additional amplifier subsection 310 is described as being a low-power amplifier, it may alternatively have larger or more transistor cells than the high-power amplifier subsection 142.

In the embodiment illustrated in FIG. 3, the operation of the bypass amplifier 130 is substantially the same as described above. In one particular implementation, for instance, the amplifier subsections 140, 142, 310 are disabled when the bypass mode is selected and the ultra-low-power amplifier subsection 180 is enabled.

Figure 4:
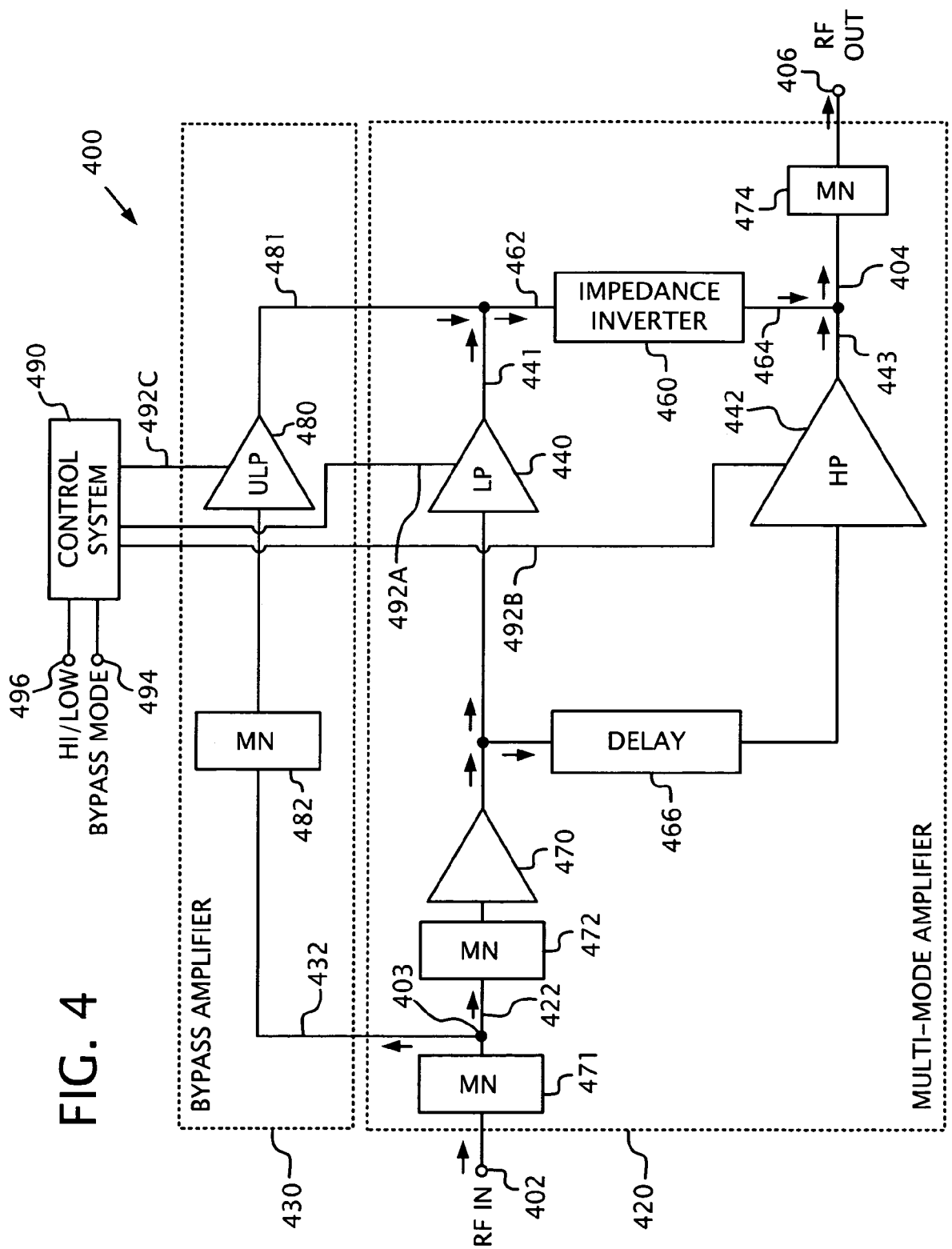
FIG. 4 is a schematic block diagram of an amplifier circuit in accordance with a second representative embodiment of the disclosed technology.

FIG. 4 is a schematic block diagram of a circuit 400 according to another embodiment of the disclosed technology. The circuit 400 comprises an input node 402 configured to receive an input signal, such as an RF input signal ("RF IN"), and an impedance matching network 471. At a branch 403, the input signal is routed on a signal path 422 to a multi-mode amplifier 420 and on a bypass path 432 to a bypass amplifier 430. The bypass path 432 is coupled to an impedance matching network 482, which has an output coupled to an ultra-low-power amplifier 480. The ultra-low-power amplifier 480 is configured to provide an amplified signal on an ultra-low-power signal path 481. In the multi-mode amplifier 420, the signal path 422 is coupled to an impedance matching network 472, which has an output coupled to a preliminary stage amplifier 470. The preliminary stage amplifier 470 has an output that is coupled to a low-power amplifier 440 and a delay element 466. The low-power amplifier 440 is configured to provide an amplified signal on a low-power signal path 441. The low-power signal path 441 is combined with the ultra-low-power signal path 481 to produce a combined low-power signal path 462, which is coupled to an input of an impedance inverter 460. An output of the impedance inverter 460 is coupled to an impedance-inverter output path 464. The delay element 466 is coupled to a high-power amplifier subsection 442, which is configured to produce an amplified signal on a high-power signal path 443. The high-power signal path 443 is combined with the impedance-inverter output path 464 to create a combined output path 404. The combined output path 404 is coupled to an impedance matching network 474, which is coupled to an output node 406.

The circuit 400 does not comprise a switching mechanism to selectively route the input signal from the input node 402 onto a separate, dedicated bypass path. Instead, the input signal from input node 402 is routed at branch 403 to the multi-mode amplifier 420 and to the bypass amplifier 430. To operate the circuit 400 in multiple power modes, the circuit 400 comprises a control system 490 configured to peripherally switch the respective amplifier subsections 440, 442, 480. For example, in the illustrated embodiment, the control system 490 produces variable bias voltages on bias-voltage paths 492A, 492B, 492C, which are respectively applied to the transistor cells of the amplifier subsections 440, 442, 480. In other representative examples, the control system 490 can be configured to turn one or more amplifier stages on or off to control power consumption.

In the illustrated embodiment, two single-bit control signals applied to a bypass-mode control node 494 and a hi/low control node 496 are used to select the power mode in which the circuit 400 is to operate. Specifically, when the bypass-mode control signal selects a bypass mode, the control system 490 produces a DC bias voltage on bias-voltage path 492C such that the ultra-low-power amplifier subsection 480 is operated in its normal, fully biased state (for example, as a linear amplifier). Correspondingly, the control system 490 reduces or terminates the bias voltages on bias-voltage paths 492A, 492B, such that the low-power amplifier subsection 440 and the high-power amplifier subsection 442 are disabled.

If the bypass-mode control signal 494 is selected to disable the bypass amplifier 430, then the value of the hi/low signal can be used to determine whether the multi-mode amplifier 420 is to be operated in high-power mode or low-power mode. If the multi-mode amplifier 420 is operated in high-power mode, both the low-power amplifier subsection 440 and the high-power amplifier subsection 442 are controlled via bias-voltage paths 492A, 492B to operate at a normal, fully biased state. In the low-power mode, the high-power amplifier subsection 442 is disabled by reducing or terminating the DC bias voltage to the transistors in the high-power amplifier subsection. This causes an increase in load impedance on the combined low-power signal path 462. In both of the high- and low-power modes, the bias voltage on the bias-voltage path 492C to the ultra-low-power amplifier 480 is adequately reduced or terminated such that the ultra-low-power amplifier is disabled. In this manner, the multi-mode amplifier 420 and the bypass amplifier 430 can be operated mutually exclusively of one another, thus enabling the impedance inverter 460 to provide the desirably high impedance in both low-power and ultra-low-power modes.

Figure 5:
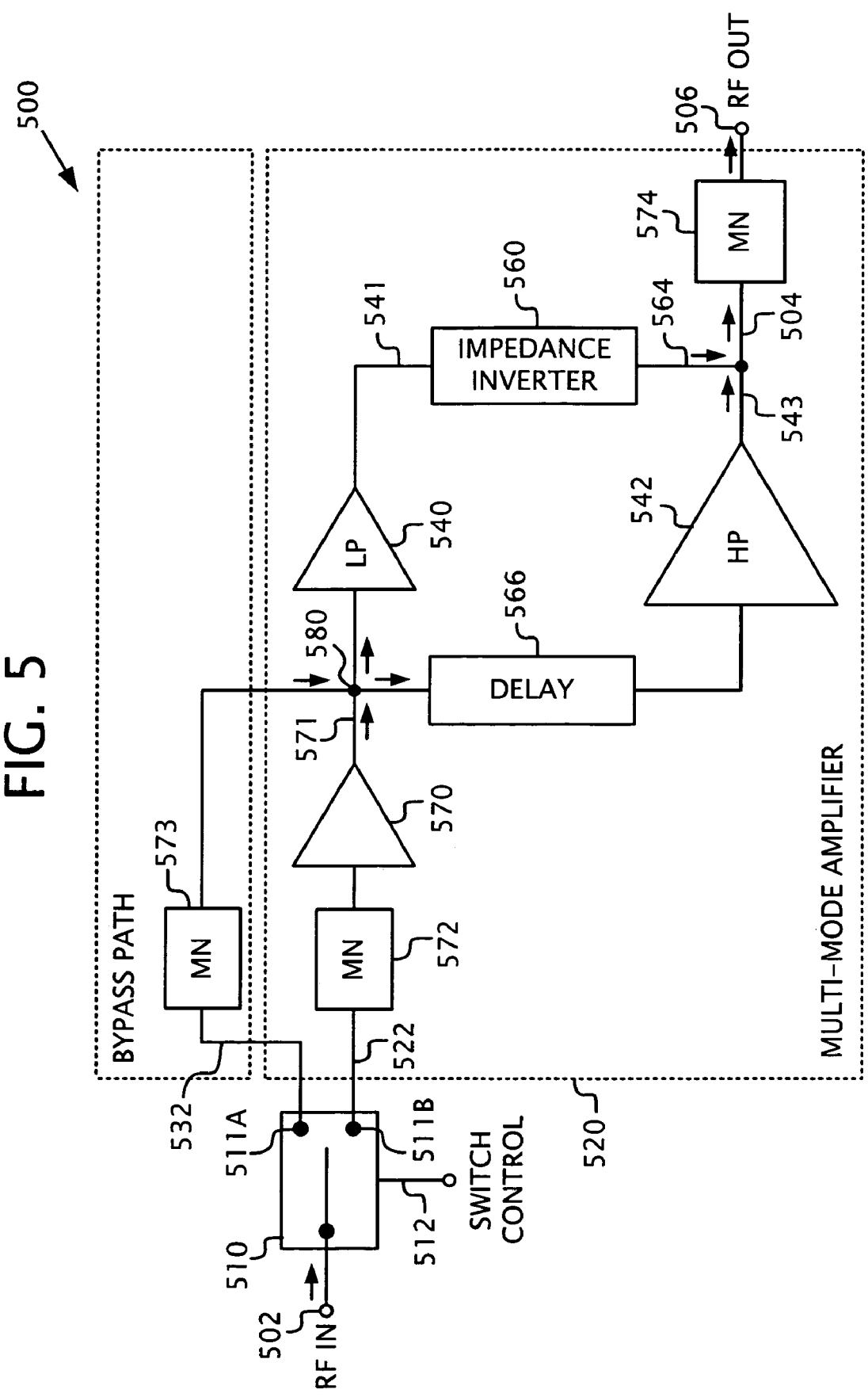
FIG. 5 is a schematic block diagram of an amplifier circuit in accordance with a third representative embodiment of the disclosed technology.

FIG. 5 is a schematic block diagram of a circuit 500 illustrating another exemplary embodiment of the disclosed technology. The circuit 500 comprises an input node 502 configured to receive an input signal such as an RF input signal ("RF IN"). The input node 502 is coupled to a switch 510 that includes switch output nodes 511A, 511B and a control input 512. The switch output node 511A is coupled to an intermediate input node 580 through impedance matching network 573 by a bypass path 532 so that the input signal RF IN can be delivered to a low-power amplifier subsection 540 and a delay element 566. The switch output node 511B is coupled to an impedance matching network 572, which has an output coupled to a preliminary stage amplifier 570. The preliminary stage amplifier 570 is coupled to the intermediate input node 580 by a signal path 571. From the intermediate input node 580, the input signal RF IN is delivered to the low-power amplifier subsection 540 and the delay element 566. The delay element 566 is coupled to a high-power amplifier subsection 542, which produces an amplified signal on a high-powered amplified signal path 543. The high-powered amplified signal path 543 is combined with an impedance-inverter output path 564 to create a combined output path 504. The combined output path 504 is coupled to an impedance matching network 574, which is coupled to an output node 506.

The circuit 500 does not include a separate, dedicated ultra-low-power amplifier coupled to the bypass path 532. Instead, the bypass path 532 routes the input signal RF IN from an output node 511A through impedance matching network 573 to the intermediate input node 580, where the input signal is input into amplifier subsections 540, 542 and amplified in the multi-mode amplifier 520 in the manner described above. In other words, the switching mechanism 510 and the bypass path 522 are used to bypass the preliminary stages of amplification, and to route the input signal directly into the final amplification stage. In one implementation, the preliminary amplifier subsection 570 and the high-power subsection 542 are biased off when the bypass path 522 is selected. The switching mechanism 510 desirably produces high isolation between the path 522 and the bypass path 532 to reduce any signal loss when the bypass path is selected and to prevent oscillation when the multi-mode amplifier 520 is activated. For this reason, the bypass path 532 is desirably a direct path to the intermediate input node 580 with few (if any) additional elements that may degrade or otherwise interfere with the propagation of the input signal.

In operation, and according to one exemplary embodiment, when the switching mechanism 510 routes the input signal onto the path 522, the bypass path 532 is disabled and has a correspondingly high impedance (effectively an open circuit). Consequently, the input signal is amplified by the preliminary amplifier subsection 570 and the amplifier subsections 540, 542 with substantially no loading or interference from the bypass path 532. Correspondingly, when the switching mechanism 510 routes the input signal onto the bypass path 532, the preliminary amplifier subsection 570 is desirably disabled (for example, by a control system) such that the impedance on preliminary amplifier signal path 571 becomes large. Thus, the input signal can be amplified directly by the amplifier subsections 540, 542 without substantial interference from the preliminary amplifier subsection 570.

Figure 6:
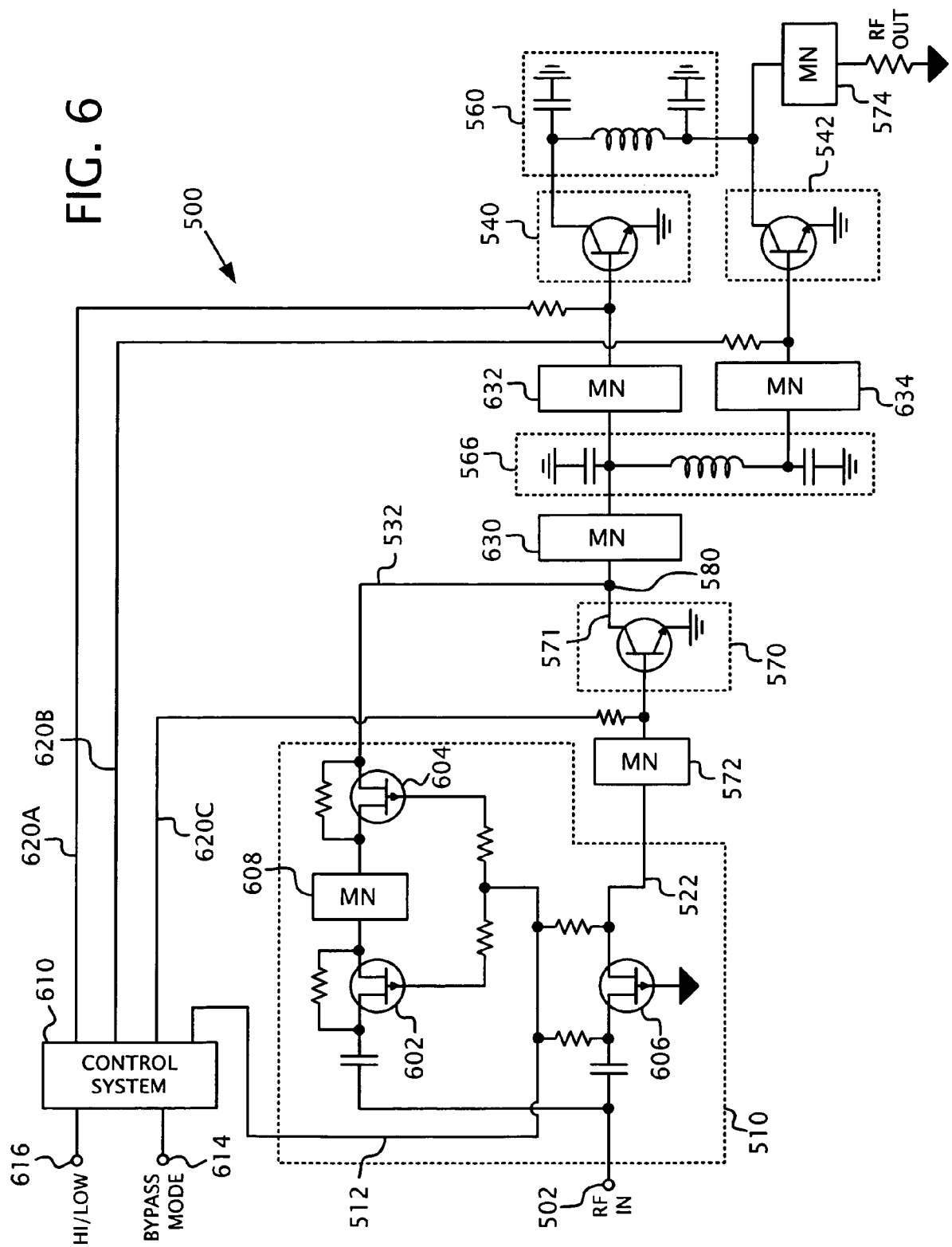
FIG. 6 is a schematic circuit diagram showing a more specific implementation of the amplifier circuit of FIG. 5.

FIG. 6 is a schematic block diagram showing a more specific implementation of the exemplary circuit 500 described above with respect to FIG. 5. In FIG. 6, the switching mechanism 510 comprises an RF switch. In particular, the illustrated switching mechanism 510 is a single-pole double-throw RF switch comprising resistors, capacitors, and three transistors 602, 604, 606 (for example, pHEMTs) configured to allow the switch to operate with high linearity and low loss. The illustrated RF switch further comprises an impedance matching network 608 configured to match the impedance of the upstream RF signal source when the bypass mode is selected. Desirably, the switching mechanism 510 routes the input signal onto the path 522 or the bypass path 532 with high isolation. For example, in the illustrated embodiment, high isolation is provided by the transistors 602, 604, 606. In the illustrated embodiment, the switching mechanism 510 is operated by a control system 610, which is further configured to control DC bias voltages on bias-voltage paths 620A, 620B, 620C, that are respectively applied to the amplifier subsections 540, 542, 570. As with the control systems described above, the control system 610 comprises a network configured to provide adjustable DC bias voltages to the bases of the transistors in the amplifier subsections 540, 542, 570, allowing the circuit 500 to operate in the desired power modes. For illustrative purposes only, a single transistor is shown in each of the amplifier subsection 540, 542, 570. In the actual implementations, however, each of the amplifier subsections 540, 542, 570 may contain multiple transistors. The illustrated embodiment further includes impedance matching networks 630, 632, 634.

According to the illustrated embodiment, two single-bit control signals (bypass-mode signal 614 and hi/low signal 616) are used to select the power mode in which the circuit 500 is to operate. Specifically, if the bypass-mode control signal 614 is enabled, the switching mechanism 510 is operated via switch control path 512 to route the input signal from the input node 502 onto the bypass path 532 and to the intermediate input node 580, where it is input directly into the amplifier subsections 540, 542. In this mode, and according to one exemplary implementation, the control system 610 also reduces or terminates the DC bias voltage on bias-voltage path 620C such that the preliminary amplifier subsection 570 is disabled. Consequently, the impedance at the output of the amplifier subsection 570 becomes very high, and the amplifier subsections 540, 542 can operate without substantial interference from the preliminary amplifier subsection 570. If the bypass-mode control signal 614 is disabled, then the switching mechanism 510 routes the input signal onto the path 522 and to the preliminary amplifier subsection 570. In this case, the transistor 604 in the switching mechanism 510 is disabled, and the impedance on the bypass path 532 becomes very high. Accordingly, the amplifier subsection 540, 542, 570 can operate without substantial interaction with the bypass path 532.

In both instances, the value of the hi/low signal 616 can be used to determine how the amplifier subsections 540, 542 are to be operated. For example, if high-power mode is selected, both the low-power amplifier subsection 540 and the high-power amplifier subsection 542 are controlled via bias-voltage paths 620A, 620B to operate in their normal, fully biased states. That is, the transistors in both of the amplifiers 540, 542 are adequately biased such that the amplifiers perform with high linearity. In the low-power mode, however, the high-power amplifier subsection 542 is disabled by reducing the DC bias to its transistors. As explained above, the impedance inverter 560 can be configured to have an input impedance that matches the impedance of the low-power amplifier subsection 540 during high-power operation and to have a greater impedance during low-power operation.

As above, those of ordinary skill in the art will recognize that there exist numerous bias circuits and control networks that can be used to implement the control system 510. For example, any of the bias control structures and methods described in U.S. Patent Application Publication No. 2004/0056711 can be used to provide bias voltages to the amplifier subsections 540, 542, 570. Further, although the impedance inverter 560 and the delay circuit 566 are shown as shunt-C, series-L, shunt-C networks, other circuit configurations can be used to achieve the desired functionality (for example, other circuit configuration that behave as a quarter-wavelength transmission line).

In one exemplary embodiment, the amplifier subsections 540, 542, 570 are implemented at least in part using an HBT process, whereas the switching mechanism 510 and the control system 610 (as well as the related bias control network) are implemented at least in part using a pHEMT process. This embodiment can be implemented, for example, on two or more chips or on a single chip.

Having illustrated and described the principles of the illustrated embodiments, it will be apparent to those skilled in the art that the embodiments can be modified in arrangement and detail without departing from such principles. For example, the described amplifier embodiments do not necessarily need to operate as linear amplifiers when enabled, but may be operated as other types of amplifiers. Further, although several of the disclosed embodiment utilize bias toggling to control respective amplifier subsections, other means of selectively enabling and disabling the amplifier subsections can be used. For instance, in embodiments using bipolar junction transistors (BJTs) in the amplifier subsections, the collector-to-emitter voltages of the BJTs can be selectively controlled in order to enable and disable the respective amplifier subsections. Equivalently, in embodiments using field-effect transistors, the drain-to-source voltages can be selectively controlled. Further, the number and location of the impedance matching networks as shown and described herein should not be construed as limiting, as this may vary from implementation to implementation. Likewise, the particular configurations of the control signals described herein should not be construed as limiting. Instead, the control signals can be configured to operate the amplifiers subsections in various other combinations and subcombinations with one another. For example, the amplifier subsections may be independently controllable. In view of the many possible embodiments, it will be recognized that the illustrated embodiments include only examples and should not be taken as a limitation on the scope of the invention. Rather, the invention is defined by the following claims. We therefore claim as the invention all such embodiments that come within the scope of these claims.

What is claimed is:

1. A circuit, comprising:
   a control system;
   a first amplifier section coupled to the control system, the first amplifier section being configured to amplify at least a portion of an input signal and produce a first amplified signal on a first signal path in a first mode of operation;
   a second amplifier section coupled to the control system, the second amplifier section being configured to amplify at least a portion of the input signal and produce a second amplified signal on a second signal path in a second mode of operation;
   an RF switch coupled to the control system and operable to route the input signal to the first amplifier section in the first mode of operation and to route the input signal to the second amplifier section in the second mode of operation; and
   an impedance inverter having an input coupled to the first and second signal paths.

2. The circuit of claim 1, further comprising a third amplifier section configured to amplify at least a portion of the input signal and produce a third amplified signal on a third signal path in the first mode of operation, the third signal path being coupled to an output of the impedance inverter to provide a combined output path.

3. The circuit of claim 2, wherein the first amplifier section and the second amplifier section are configured to produce a lower output power than an output power produced by the third amplifier section.

4. The circuit of claim 2, wherein the first amplifier section and the third amplifier section are configured to operate in two or more additional power modes in the first mode of operation.

5. The circuit of claim 1, wherein the impedance inverter comprises a shunt-C, series-L, shunt-C network.

6. The circuit of claim 1, wherein the impedance inverter operates substantially in accordance with the equation, $Z_o^2 = Z_{IN} \times Z_{OUT}$, where $Z_o$ is the characteristic impedance of the impedance inverter, $Z_{IN}$ is an impedance at the input of the impedance inverter, and $Z_{OUT}$ is a load impedance at the output of the impedance inverter.

7. The circuit of claim 1, wherein the impedance inverter is selected to have a characteristic impedance substantially equal to an effective load impedance of the first amplifier section.

8. The circuit of claim 1, wherein the control system comprises a bias voltage network providing variable bias voltages to the first amplifier section and the second amplifier section.

9. The circuit of claim 1, wherein the RF switch is defined on a first semiconductor substrate and the first amplifier section and the second amplifier section are defined on a second semiconductor substrate.

10. The circuit of claim 1, wherein the RF switch comprises one or more field effect transistors and wherein the first amplifier section and the second amplifier section each comprise one or more bipolar junction transistors.

11. A circuit, comprising:
   a first amplifier section configured to receive an input signal and provide a first amplified signal on a first signal path;
   a second amplifier section configured to receive the input signal and provide a second amplified signal on a second signal path;
   a third signal path configured to input a third signal;
   a third amplifier section configured to receive the input signal and provide the third signal on the third signal path;
   an RF switch having an input coupled to receive the input signal, a first output coupled to the first and second amplifier sections, and a second output coupled to the third amplifier section;
   a first junction at which the second signal path and the third signal path are combined to provide a combined signal path;
   an impedance inverter having an input coupled to the combined signal path and an output coupled to an impedance-inverter output path; and
   a second junction at which the first signal path and the impedance-inverter output path are combined to provide a combined output path.

12. The circuit of claim 11, further comprising a control system configured to operate only one of the second amplifier section and the third amplifier section at one time.

13. The circuit of claim 11, wherein the second amplifier section and the third amplifier section are configured to produce a lower output power than an output power produced by the first amplifier section.

14. The circuit of claim 11, further comprising a control system configured to disable the first amplifier section in a low-power mode of operation.

15. A signal-amplification method, comprising:
receiving an input signal;
selecting at least a first mode of operation or a second mode of operation;
in the first mode of operation, providing a first signal gain to the input signal to produce a first amplified signal, and coupling at least a portion of the first amplified signal to an input of an impedance inverter; and
in the second mode of operation, providing a second signal gain to the input signal to produce a second amplified signal, and coupling at least a portion of the second amplified signal to the input of the impedance inverter,
wherein the first signal gain is provided by a first amplifier on a first amplification path, and wherein the second signal gain is provided by a second amplifier on a second amplification path, the method further comprising operating the first amplifier in one of multiple additional power modes in the first mode of operation.

16. The method of claim 15, further comprising reducing a bias voltage applied to at least a portion of the first amplifier during the second mode of operation.

17. The method of claim 15, further comprising routing the input signal to the second amplifier during the second mode of operation such that the input signal is isolated from the first amplifier.

* * * * *